United States Patent [19]
Hiraishi

[11] Patent Number: 6,063,189
[45] Date of Patent: May 16, 2000

[54] MECHANISM FOR CLAMPING A CRYSTAL BODY IN A CRYSTAL-BODY LIFTING DEVICE

[75] Inventor: Yoshinobu Hiraishi, Omura, Japan

[73] Assignee: Komatsu Electric Metals Co., Ltd., Kanagawa, Japan

[21] Appl. No.: 09/176,173

[22] Filed: Oct. 21, 1998

[30] Foreign Application Priority Data

Oct. 23, 1997 [JP] Japan ................................. 9-290581

[51] Int. Cl.[7] .................................................. C30B 35/00

[52] U.S. Cl. ........................... 117/218; 117/217; 117/911

[58] Field of Search .................................. 117/200, 217, 117/218, 900, 911

[56] References Cited

U.S. PATENT DOCUMENTS

| | | | |
|---|---|---|---|
| 5,879,448 | 3/1999 | Urano et al. | 117/13 |
| 5,910,216 | 6/1999 | Nakamura et al. | 117/218 |
| 5,935,321 | 8/1999 | Chiou et al. | 117/13 |
| 5,935,329 | 8/1999 | Schulmann | 117/218 |
| 5,938,843 | 8/1999 | Hiraishi et al. | 117/218 |
| 5,951,759 | 9/1999 | Inagaki et al. | 117/218 |

*Primary Examiner*—Felisa Garrett
*Attorney, Agent, or Firm*—Welsh & Katz, Ltd.

[57] ABSTRACT

A clamping portion 2 is suspended by wire cables 5. A linkage 3 connects the clamping portion 2 and a contacting portion 4 disposed below the clamping portion 2. One end of a circular-arc member 1 is pivotally supported by a swivel axis 33. The circular-arc member 1 is swiveled by guiding the contacting portion 4 to contact with the shoulder 63 of the crystal body 6.

10 Claims, 12 Drawing Sheets

MECHANISM FOR CLAMPING A CRYSTAL BODY IN A CRYSTAL-BODY LIFTING DEVICE

BACKGROUND OF THE INVENTION

1. Field of the Invention

This invention relates to a device for lifting crystal bodies, such as silicon single crystals, by the CZ method. It especially relates to the crystal-body clamping mechanism of a crystal-body-lifting device capable of safely lifting large-diameter crystal bodies, namely heavy crystal bodies. The crystal-body clamping mechanism clamps the neck portions formed on the top portion of crystal bodies during the lifting operation.

2. Description of Prior Art

In the process of lifting crystal bodies, such as silicon single crystals by the CZ method, a seed crystal installed within a seed-crystal holder suspended by a suspension member is guided to touch the free surface of the melted liquid of the raw material stored in a crucible. Then, the seed crystal is gradually lifted from the melted liquid and at the same time the suspension member is rotated to grow a single crystal beneath the lower portion of the seed crystal.

The number of chips with the same physical properties obtained from one piece of semiconductor wafer can be increases, as the diameter of the wafer increases. Therefore, for economic reasons, the need for large-diameter semiconductor wafers has been increasing in recent years. As the diameter of the crystal bodies enlarge, the weight of an individual single crystal increases. For example, the weight of a crystal body having 300 mm in diameter and 750 mm in body-length can reach a value more than 150 Kg.

In the process of lifting conventional lightweight crystal bodies, the load capacity of the small diameter portion beneath the seed crystal by using a dash neck method (hereinafter refer as dash neck) being lifted can afford to support the weight of the crystal body. Therefore, it is not necessary to make any reinforcement to its strength. However, in the event of supporting the above heavy crystal body by the strength of the dash neck alone, it is very difficult to maintain stable support of the whole weight of the crystal body if heat variation occurs in the surroundings of the crystal body, or an unexpected vibration, or a swinging of the crystal body is induced. As a result, when loads are concentrated at a so-called dash neck, which is a small-diameter portion for removing the dislocation from the seed crystal, the breakage of the dash neck and then the crystal body drops. This results not only the lost of crystal body but also a very great amount of damage of the lifting device.

To prevent the dropping of the crystal body, "a crystal lifting device" disclosed in Examined Japanese Patent Publication H7-10300 and "a device and a method for lifting single crystals" disclosed in Non-Examined Japanese Patent Publication H9-2893 are known. In both of the above lifting devices, a neck portion is formed on the top of the crystal body beforehand, and several holding levers or arms extending from the seed crystal holder clamp the neck portion.

However, for a crystal body of 300 mm diameter, the distance from the seed crystal holder to the neck portion is over 500 mm. Therefore, the above holding levers or arms should be longer than 500 mm. This will induce a very large moment to be imposed on the above holding levers or arms. It is also difficult to construct a mechanism having the strength enough to bear the moment within a confined space of the lifting device.

Furthermore, in the case of employing holding levers or arms, the crystal body can not be firmly grasped unless the neck portion is clamped rigidly by strong horizontal forces. Because stiff levers or arms are lacking in flexibility, a horizontal shifting of the crystal body would be incurred if the contact timing or the clamping forces of each the levers or arms are biased during the clamping of the crystal body. Therefore, there exists a danger that the crystal body will break at the neck portion.

SUMMARY OF THE INVENTION

In view of the above drawbacks, the object of this invention is to provide a crystal-body clamping mechanism suitable to be installed in a crystal-body-lifting device. The crystal-body clamping mechanism of this invention is used to clamp the neck portion formed on the top portion of the crystal body. According to this invention, the lifting operation is safely performed even if the crystal body is heavy because the load on the seed is reduced.

Following the enlargement of the diameter of semiconductor wafers, the weight of an individual semiconductor ingot is increased. To respond to this tendency, in this invention, a neck portion consists of the large-diameter portion and the small-diameter portion is formed in the upper portion of the crystal body, and clamped so as to prevent the dropping of the crystal body.

The applicant of this invention has filed a Japanese patent application NO. H9-75344 entitle "LIFTING DEVICE FOR CRYSTAL BODIES" based upon the above-mentioned purpose. The feature of the '344 application is providing the clamping member whose swiveling members descend along the outer surface of the large-diameter portion of the crystal body, and the swiveling members close so as to clamp the crystal body when they descend to a location near the neck portion of the crystal body.

The difference between this invention and the '344 application is that the clamping mechanism of this invention does not touch the large-diameter portion of the crystal body during its descending movement, and automatically clamps the neck portion of the crystal body when the lower portion of the clamping mechanism touches the shoulder of the crystal body. Namely, a clamping portion suspended from the suspension members, a contacting portion disposed below the clamping portion, and a linkage for connecting them are provided. With this construction, when the contacting portion touches the shoulder of the crystal body, the distance between the clamping portion and the contacting portion becomes short. Consequently, the linkage directs the clamping portion to clamp the neck portion.

Further more, the circular-arc member whose one end is pivotally supported is provided and performs the clamping of the neck portion. When the circular-arc member clamps the neck portion, the circular-arc member is vertically disposed with its free end engaging the neck portion of the crystal body. Therefore, in the event that horizontal shifting of the crystal body is induced, the circular-arc member swivels to some extent because the circular-arc member is pivotally supported at one end, thereby the shifting of the crystal body is absorbed.

In the prior art, when the load was shifted from the crystal body to the clamping mechanism, the crystal body would swing due to the existence of biasing forces. This would shift the crystal growth boundary away from the rotation center and the crystal body might grow into an arched shape. Additionally, there exists a danger of being unable to maintain the single-crystal state because the temperature change was incurred. This invention will not bring about such problems. Moreover, the circular-arc member will not impose a large force to the neck portion at the time of contacting, even if the contact is performed with time lags among different contact sites.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

The following are descriptions of embodiments with reference made to the above drawings.

The First Embodiment

Figure 1:
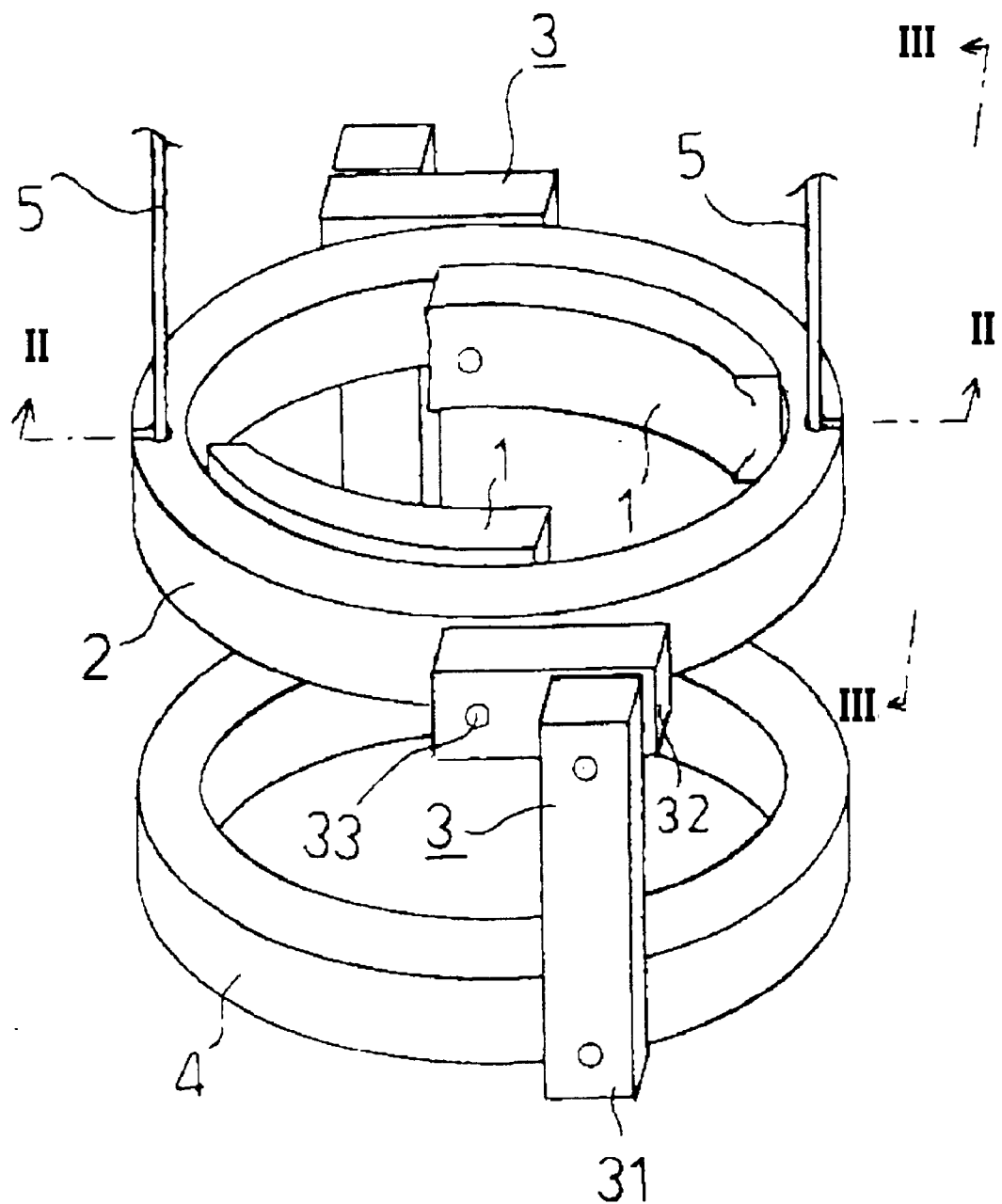
FIG. 1 is a schematic drawing showing the structure of the clamping mechanism provided in the lifting device in accordance with the first embodiment of this invention.

FIG. 1 is a schematic drawing showing the structure of the clamping mechanism provided in the lifting device in accordance with the first embodiment of this invention. As shown in FIG. 1, the clamping mechanism of this invention comprises: a clamping portion 2 suspended by two suspension members, namely, wire cables 5; a contacting portion 4 disposed below the clamping portion 2; two linkages 3 for connecting the clamping portion 2 and the contacting portion 4; and two circular-arc members 1 capable of swiveling to clamp the crystal body (not shown) under the guidance of the linkage 3. The linkages 3 and the circular-arc members 1 are respectively in pairs and disposed in a manner symmetric to and encompassing the central line of the crystal body being lifted.

Figure 2A:
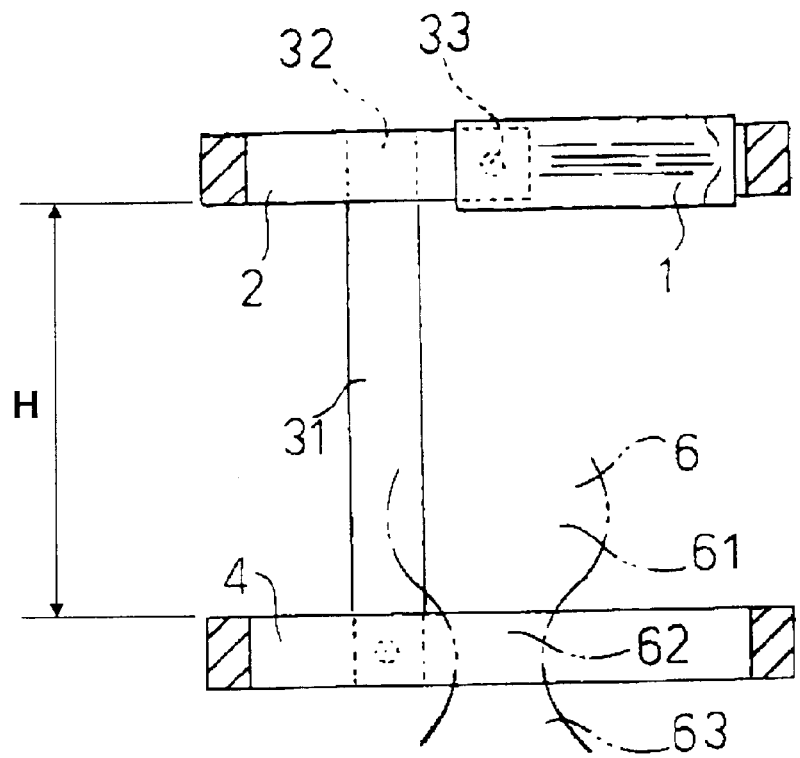
FIGS. 2a and 2b are cross sectional views along line II—II of FIG. 1, showing the operation of the clamping mechanism in accordance with the first embodiment of this invention.
Figure 2B:
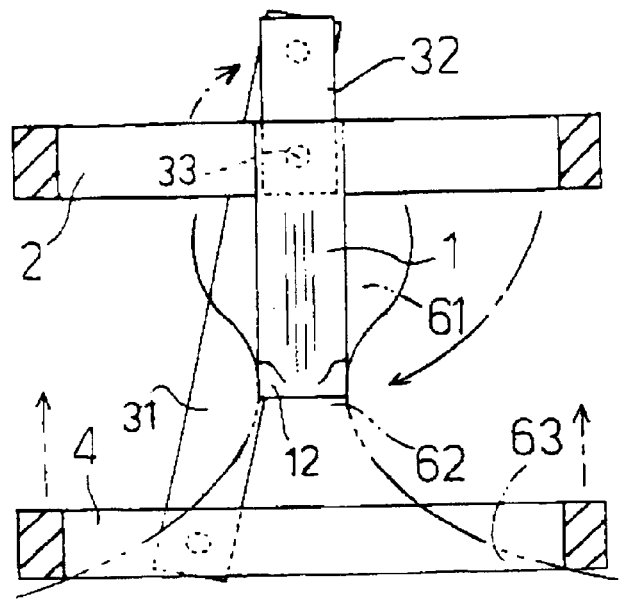
Figure 3A:
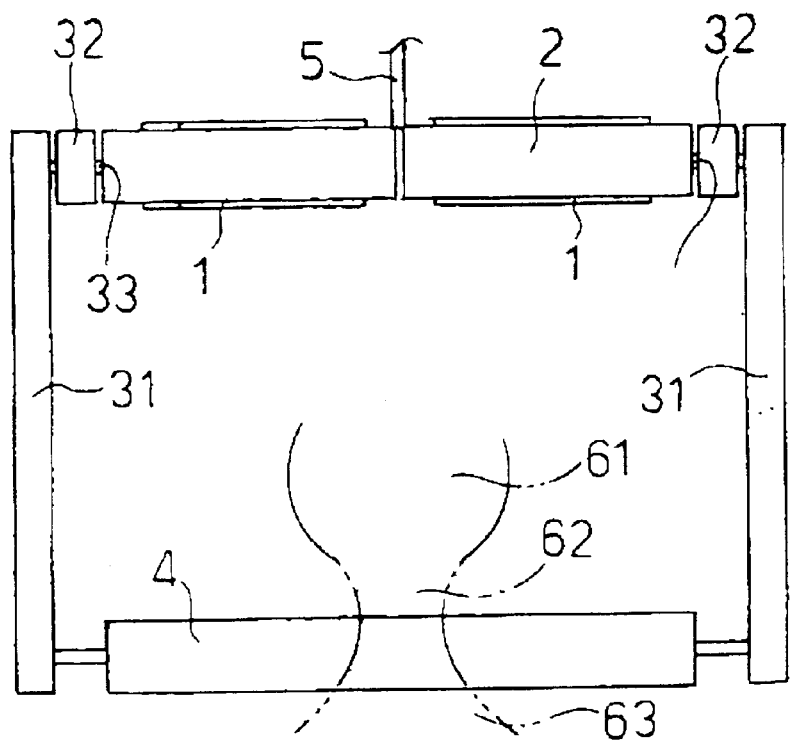
FIGS. 3a and 3b are cross sectional views along line III—III of FIG. 1, showing the operation of the clamping mechanism in accordance with the first embodiment of this invention.
Figure 3B:
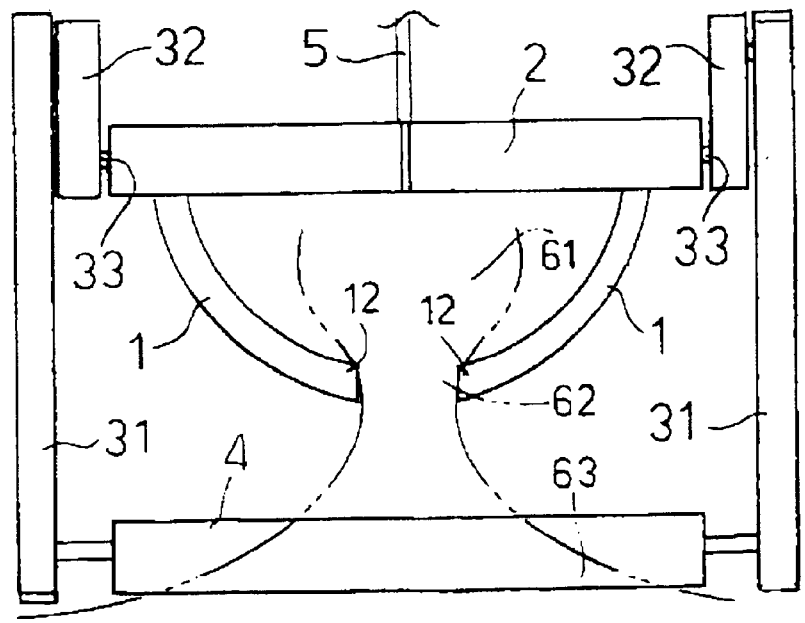

FIGS. 2a and 2b are cross sectional views along line II—II of FIG. 1, showing the operation of the clamping mechanism in accordance with the first embodiment of this invention. FIGS. 3a and 3b are cross sectional views along line III—III of FIG. 1, showing the operation of the clamping mechanism in accordance with the first embodiment of this invention. As shown in FIGS. 2 and 3, one end of the circular-arc member 1 is affixed at a swivel axis 33. The circular-arc member 1 can be driven to move downward by rising the linkage 3.

As shown in FIG. 1, the linkage 3 consists of a vertical member 31 disposed vertically, whose lower end engages with the contacting portion 4, and a horizontal member 32 disposed horizontally, whose one end is affixed at the swivel axis 33 and the other end is connected with the vertical member 31.

As described hereinafter, the vertical member 31 substantially raises the horizontal member 32 when the contacting portion 4 contacts the crystal body. Then, the horizontal member 32 rotates the swivel axis 33. As a result, the circular-arc member 1 moves downward.

Figure 4:
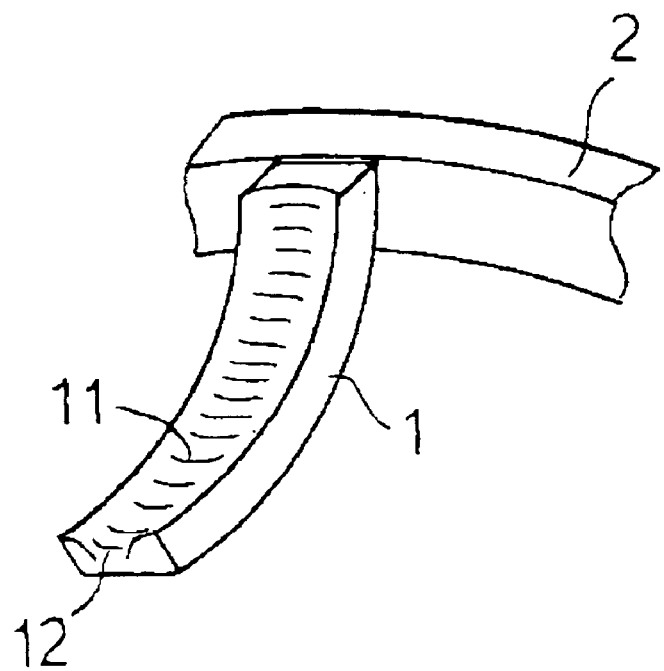
FIG. 4 is a perspective view showing the structure of the circular-arc member of the clamping mechanism in accordance with the first embodiment of this invention.

FIG. 4 is a perspective view showing the structure of the circular-arc member of the clamping mechanism in accordance with the first embodiment of this invention. As shown in FIG. 4, the circular-arc member 1 is formed in the shape of a circular arc, and the inner peripheral surface 11 and the distal free end surface 12 are shaped in a concave and formed on the same surface. The outer peripheral surface of the crystal body will move back to the central position of the concave configuration when the crystal body being lifted shifts away from its central axis to a small extent.

Figure 8:
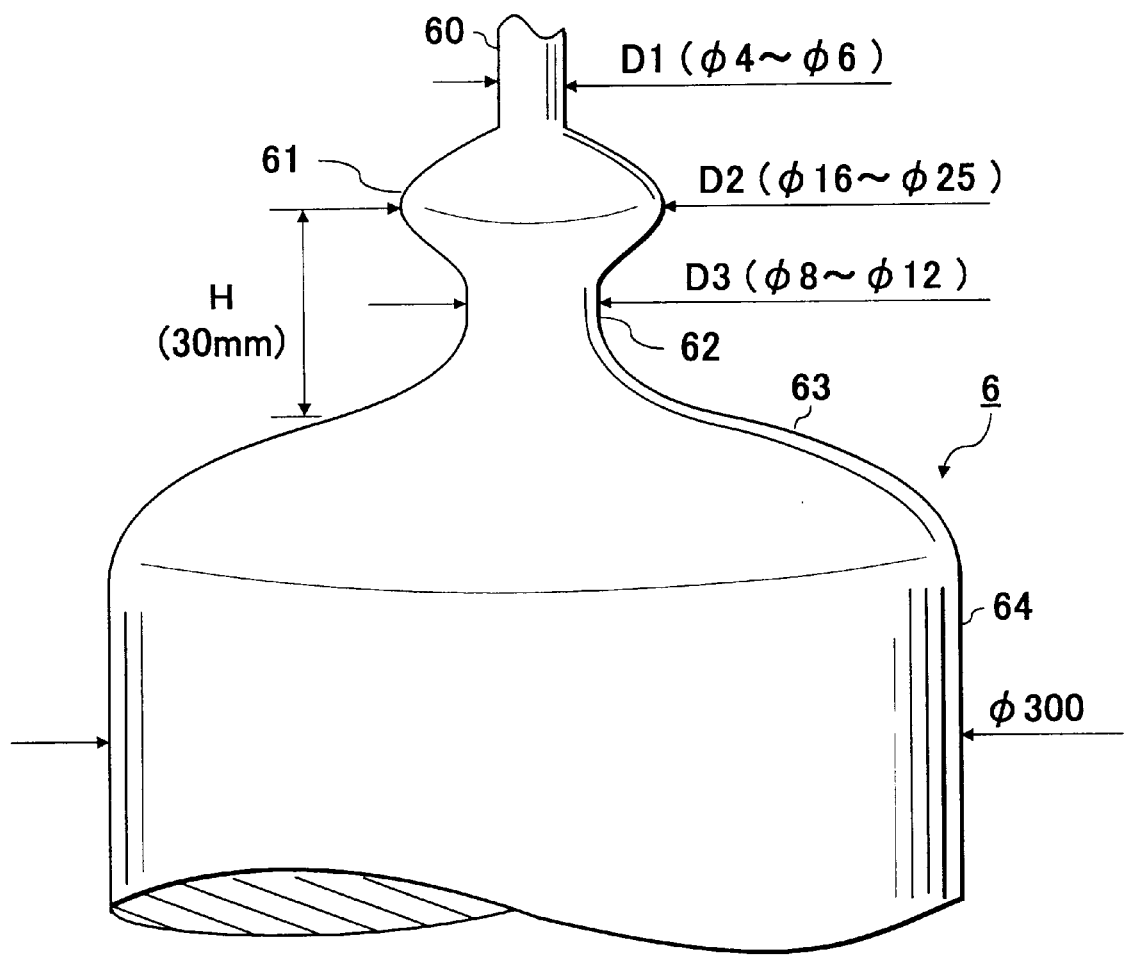
FIG. 8 is a side view showing an example of the structure of the crystal body lifted by the lifting device in accordance with this invention.

FIG. 8 is a side view showing an example of the structure of the crystal body lifted by the lifting device in accordance with this invention.

As shown in this figure, in the case that the diameter of the body 64 is formed with Φ300 mm, the dash neck 60 of D1 in diameter is formed at the top of the crystal body 6. Preferably, D1 is determined in the range of Φ4 mm to Φ6 mm. The large-diameter portion 61 of D2 in diameter is formed beneath the throttle 61. Preferably, D2 is determined in the range of Φ16 mm to Φ25 mm, which is set to twice the diameter of the neck portion 62. The neck portion 62 of D3 in diameter is formed beneath the large-diameter portion 61. Preferably, D3 is determined in the range of Φ8 mm to Φ12 mm.

Preferably, in the case of forming the crystal body 6 with the above shape, the distance H between the clamping portion 2 and the contacting portion 4 is set to 30 mm or less.

Figure 9:
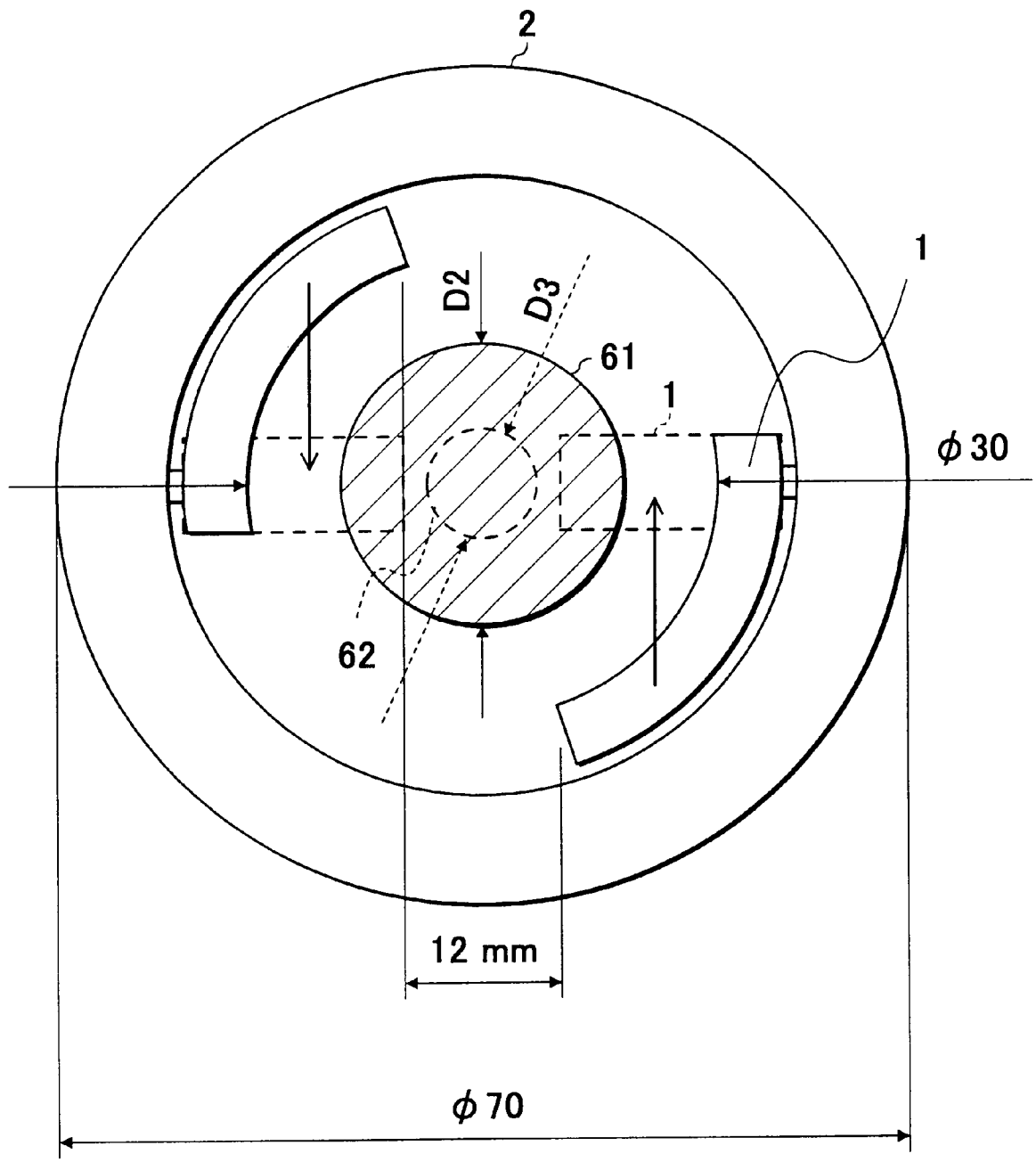
FIG. 9 is a top view showing an example of the structure of the clamping portion 2.

FIG. 9 is a top view showing an example of the structure of the clamping portion 2.

As shown in this figure, a pair of the circular-arc members 1 are arranged along the circumference of Φ30 mm so that the initial interval of their free ends are set to 12 mm. Preferably, the outside diameter of the clamping portion 2 is formed with Φ70 mm.

The following is a description of the operation of the clamping mechanism in accordance with this embodiment.

As shown in FIGS. 2a and 3a, at the beginning of lifting the crystal body 6, a large-diameter portion 61, a neck portion 62, a shoulder 63, and a body (not shown) with preset diameter are consecutively grown. As the crystal body grows, the seed-crystal holder hardly supports the weight of the crystal body. Therefore, the clamping mechanism descends as shown in FIG. 3A.

While the contacting portion 4 is not contacting the shoulder 63 of the crystal body, the vertical member 31 is maintained in a vertical attitude with the aid of the weight of the contacting portion 4, which is suspended by the linkages 3. As a result, the circular-arc member 1 engaged with the vertical member 31 is maintained in a horizontal attitude.

As shown in FIGS. 2b and 3b, the large-diameter portion passes through the contacting portion 4 without touching the inner portion thereof because the inner diameter of the contacting portion 4 is larger than the diameter of the large-diameter portion, And then the bottom of the contacting portion 4 contacts the shoulder 63 of the crystal body. At that time, the weight imposed on the linkages 3 diminishes or the linkages 3 raises the vertical members 31, and the clamping portion 2 and the circular-arc member 1 descend with the aid of their own weights. At the same time, the end of the horizontal member 32 connected with the vertical member 31 is raised and the swivel axis 33 is rotated. This drives the circular-arc member 1 to move downward, and the distal end surface 12 of the lower portion of the circular-arc member 1 clamps the neck portion 62.

As shown in FIG. 4, the inner peripheral surface 11 and the distal free end surface 12 are shaped in a concave configuration. The crystal body will move back to the central position of the concave configuration when the crystal body shifts away from the its central axis to a small extent. Thus, even if the crystal body shifts in the horizontal direction to a small extent, the lifting operation can be performed in a stable manner.

In the above embodiment, the linkages 3 and the circular-arc members 1 are respectively in pairs and disposed in the opposite locations. However, the scope of this invention is not limited to this arrangement; it is also satisfactory to keep the weight imposed on each circular-arc member balanced with the wire cables 5 and to locate the crystal body at a site in alignment with the lifting axis. For instance, it is acceptable to have three sets of the linkages and circular-arc members disposed in a radial and equally spaced manner, or four sets disposed in two pairs. Furthermore, if it is possible, the number of the circular-arc members can exceed that of the above-mentioned.

Figure 5:
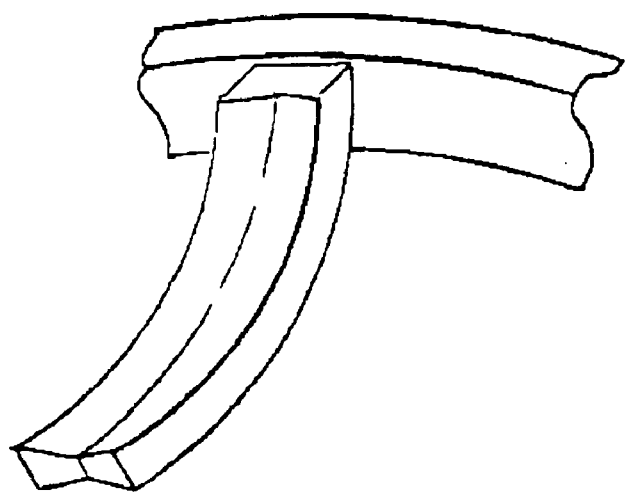
FIG. 5 is a perspective view showing the structure of another structure of the circular-arc member of the clamping mechanism in accordance with the first embodiment of this invention.

Furthermore, the inner peripheral surface 11 and the distal free end surface 12 are shaped in a concave configuration. However, the scope of this invention is not limited to this configuration, it is also satisfactory if the central portions of the inner peripheral surface 11 and the distal free end surface 12 are cut down. For example, it is also acceptable to keep their cross sections in a "V" shape or to divide the distal free end surface into two separate portions as shown in FIG. 5.

The Second Embodiment

Figure 6:
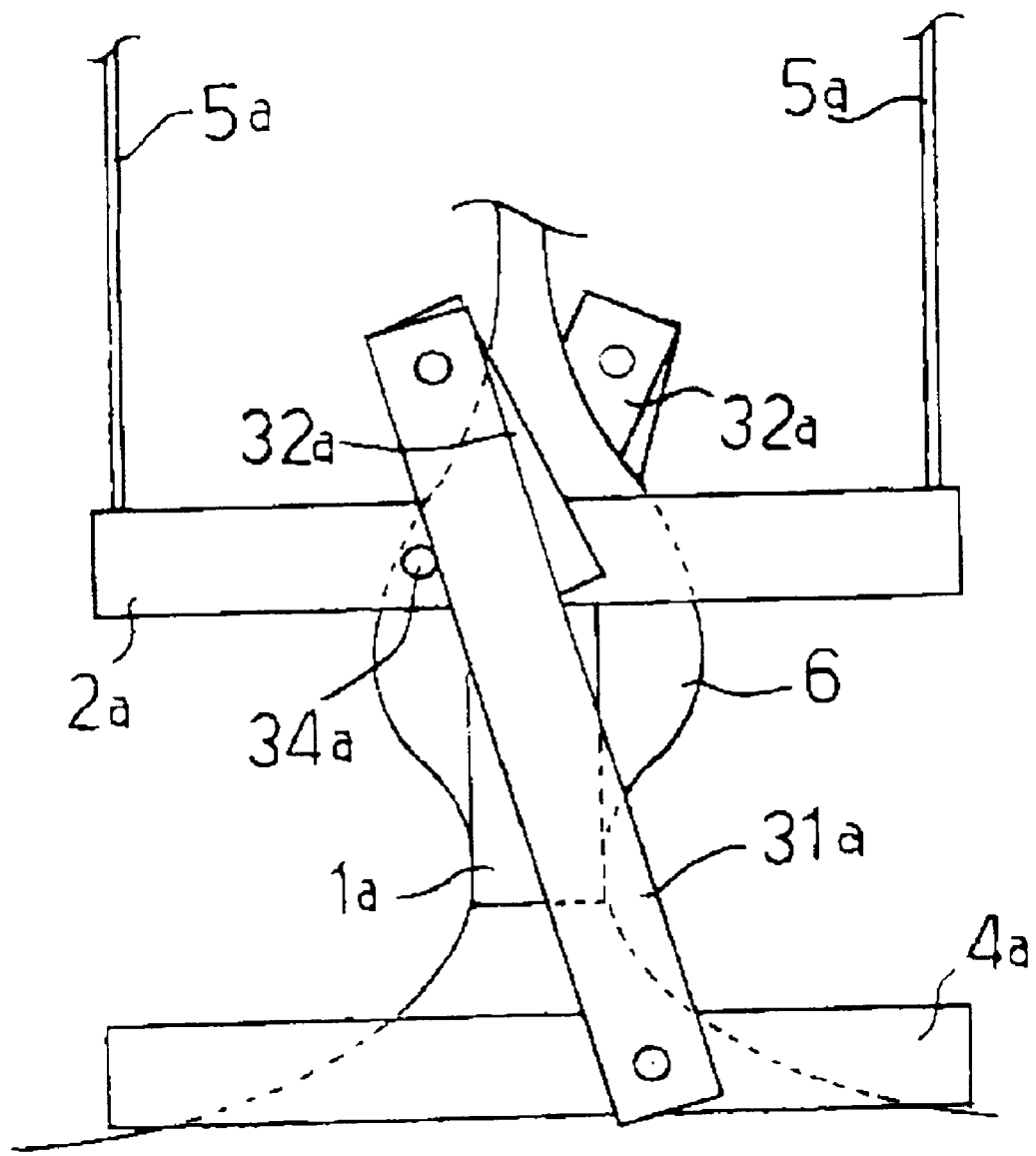
FIG. 6 is a schematic side view showing the structure of the clamping mechanism in accordance with the second embodiment of this invention.

FIG. 6 is a schematic side view showing the structure of the clamping mechanism in accordance with the second embodiment of this invention.

In the clamping mechanism in accordance with the second embodiment, an opposite-rotation hindrance mechanism is installed on the circular-arc member. The opposite-rotation hindrance mechanism prevents backward swiveling of the circular-arc member. With this construction, the circular-arc member keeps holding the crystal body when the weight of the contacting portion is imposed on the linkage again.

FIG. 6 is a schematic side view showing the structure of the clamping mechanism in accordance with the second embodiment of this invention. As shown in FIG. 6, a stopper 34a is disposed on the outer peripheral surface of the clamping portion 2a. The stopper 34a is used for hindering the overhang movement of the horizontal member 32a when the circular-arc member 1a of the clamping portion 2a clamps the crystal body 6. By this, even if the weight of the contacting portion 4a is imposed on the vertical member 31a again by lifting the wire cables 5, the backward swiveling of the horizontal member 32a will be stopped and the horizontal member 32a will remain in contact with the stopper 34a.

Means for preventing backward swiveling of the circular-arc member and release of the crystal body is not limited to the above-mentioned. It is also acceptable to form the swivel axis into a non-cylindrical shape (for example, a plate shape), and to guide the swivel axis to engage with a slot so as to hinder its further swiveling when the circular-arc member swivels. Alternatively, the swivel axis can be constructed by a ratchet mechanism.

The Third Embodiment

Figure 7:
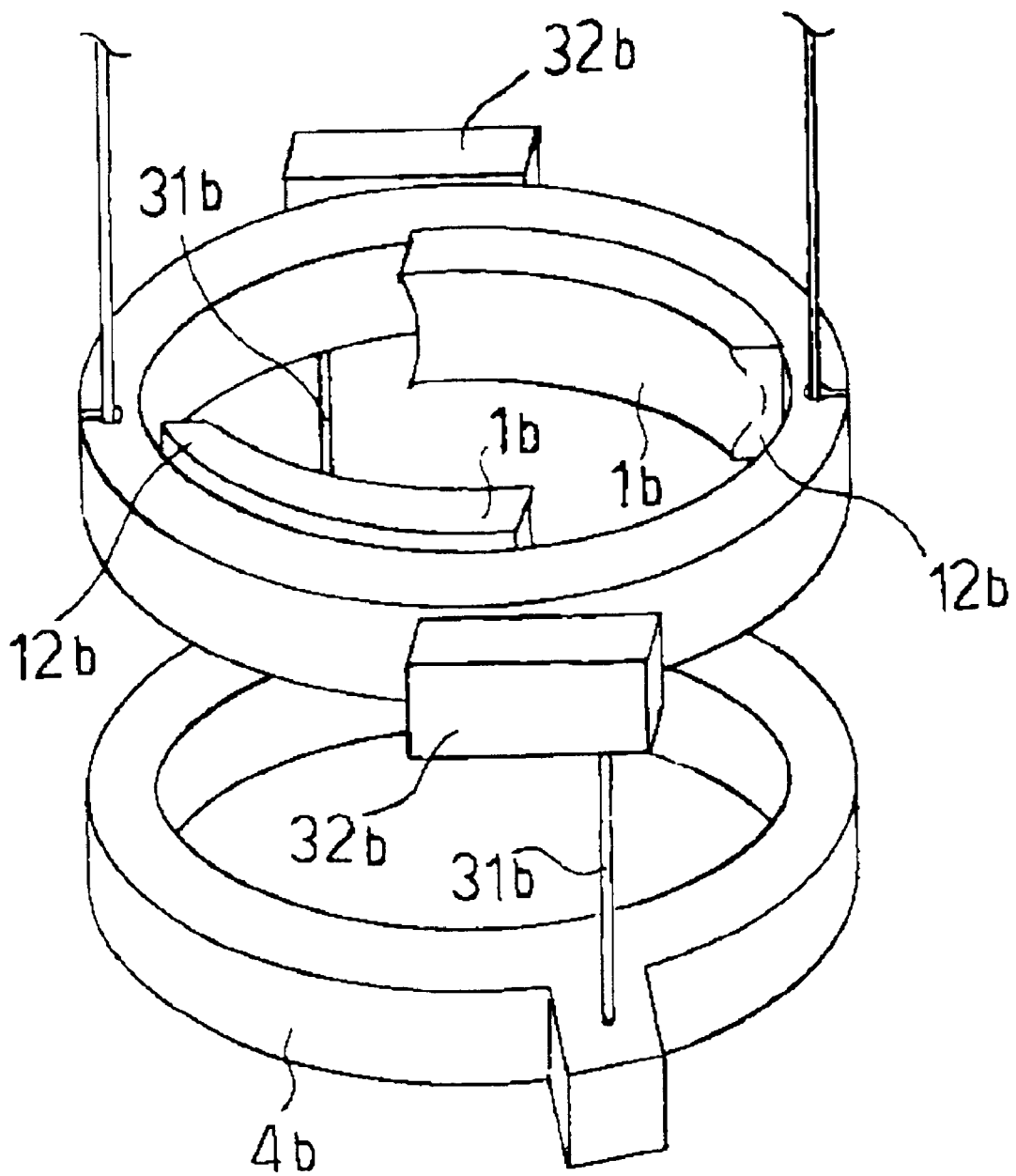
FIG. 7 is a perspective view showing the structure of the clamping mechanism in accordance with the third embodiment of this invention.

FIG. 7 is a perspective view showing the structure of the clamping mechanism in accordance with the third embodiment of this invention.

In the above embodiments, the vertical member and the horizontal member constitute the linkage. However, the same function can be attained provided that the circular-arc member is kept at its horizontal attitude with the aid of the weight of the contacting portion, the weight is removed from the circular-arc member at the time the contacting portion contacts the shoulder of the crystal body, and the circular-arc member then swivels downward by its own weight.

In this embodiment, as shown in FIG. 7, the contacting portion 4b is suspended by a linkage cable 31b. In this case, while the contacting portion 4b does not contact the shoulder of the crystal body (not shown), the circular-arc member 1b maintains its horizontal attitude with the aid of the weight of the contacting portion 4b. The weight of the contacting portion 4b is removed from the circular-arc member 1b at the time the contacting portion 4b contacts the shoulder of the crystal body. Then, the circular-arc member 1b swivels downward under the influence of the moment force induced by the weight of its distal free end 12, and the crystal body can be clamped by the circular-arc member 1b. The movement of the linkage in this embodiment is substantially the same as that of the linkage 3 in the first embodiment.

The scope of this invention is not limited to the above embodiments. Various linkages, for example gears, having the same function as those shown in the above embodiments could be employed.

Furthermore, the contacting portion is shaped like a ring in the above embodiments. The shape is not limited to this; any shape could be employed so long as the balance of the total clamping mechanism can be attained.

Moreover, wire cables were used as suspension members in the above embodiments. The suspension members are not limited to this; rods or chains such as ball chains and rudder chains can be used as suspension members.

The Fourth Embodiment

Figure 10:
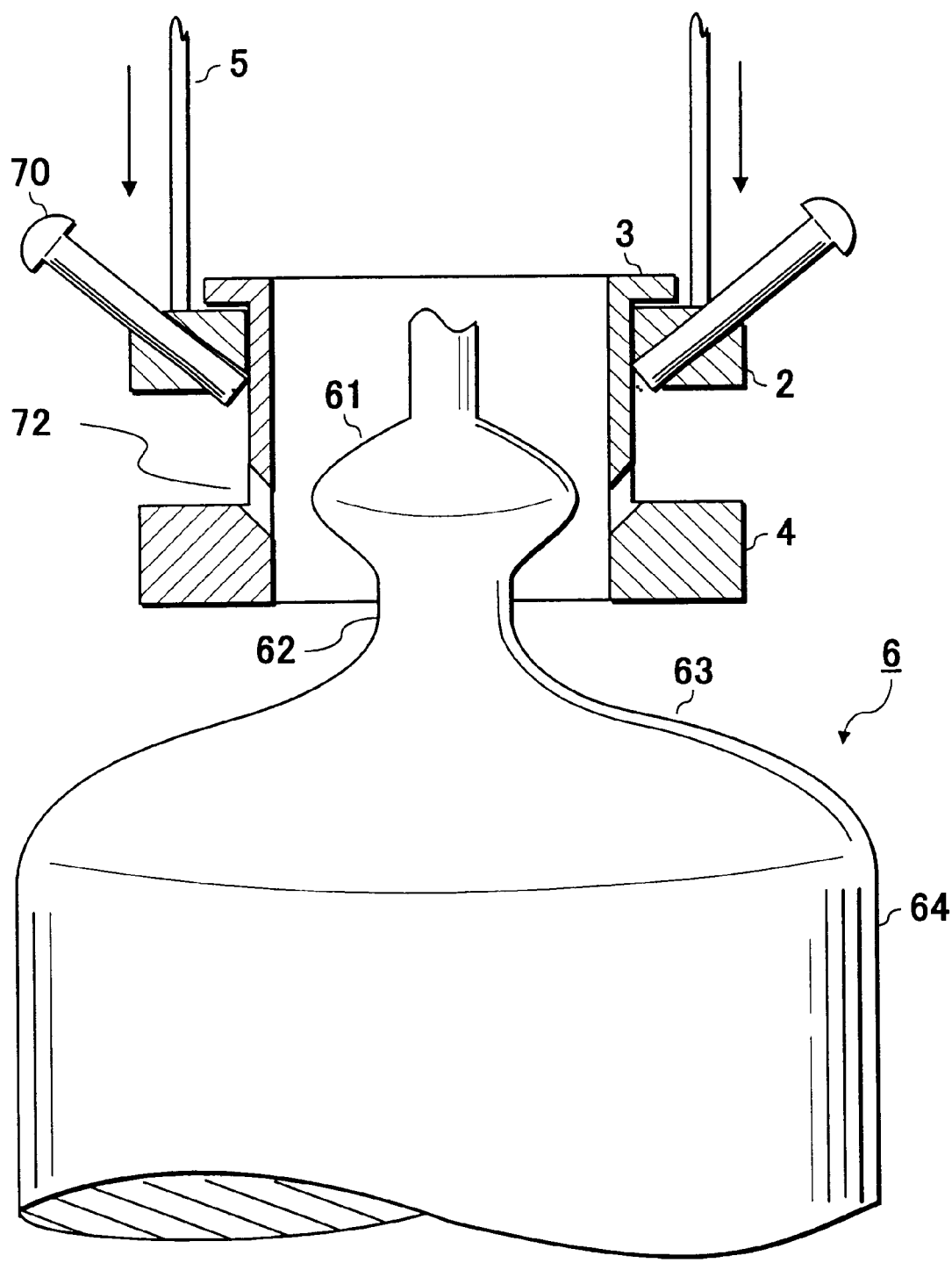
FIG. 10 is a partially sectional view showing the first structure of the crystal-body clamping mechanism in accordance with the fourth embodiment of this invention before the contacting portion 4 contacts the shoulder 63.

FIG. 10 is a partially sectional view showing the first structure of the crystal-body clamping mechanism in accordance with the fourth embodiment of this invention before the contacting portion 4 contacts the shoulder 63.

In this embodiment, a pair of the clamping pins 70 are loosely fitted in the clamping portion 2. As shown in this figure, each of the clamping pins 70 stops at the peripheral surface of the linkage 3 before contacting the shoulder 63.

The clamping portion 2 is arranged around the linkage 3 so as to be slidable along the surroundings edge of the linkage 3, and suspended by the wire cables 5.

The linkage 3 of this embodiment is formed like the cylinder, and fixed to the contacting portion 4. The through hole 72 through which the clamping pins 70 pass is formed at the lower part of the linkage 3.

Figure 11:
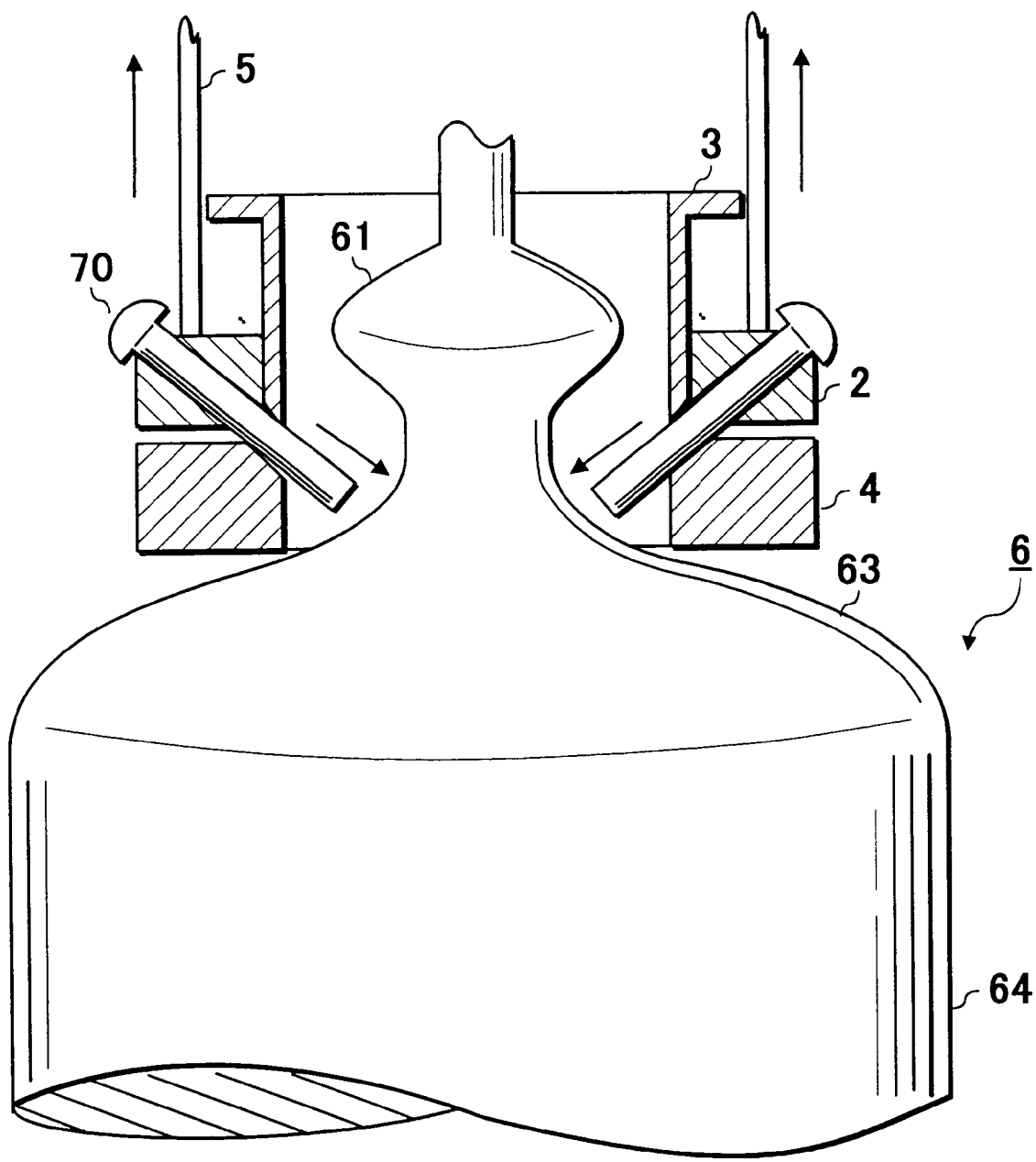
FIG. 11 is a partially sectional view showing the second structure of the crystal-body clamping mechanism in accordance with the fourth embodiment of this invention after the contacting portion 4 contacts the shoulder 63.

FIG. 11 is a partially sectional view showing the second structure of the crystal-body clamping mechanism in accordance with the fourth embodiment of this invention after the contacting portion 4 contacts the shoulder 63.

As shown in this figure, when the contacting portion 4 contacts the shoulder 63, the clamping portion 2 descends along the linkage 3 together with the clamping pins 70 or the contacting portion 4 rises as the crystal body 6 grows. Consequently, each of the clamping pins 70 pass through the through hole 72, and then protrude inside the linkage 3. After having changed in this structure, the crystal-body clamping mechanism is raised by the wire cables 5, then each of the clamping pins 70 clamps the bottom of the large-diameter portion 61. With this structure, the growth weight of the crystal body 6 is supported at the neck portion 62.

The Fifth Embodiment

Figure 12:
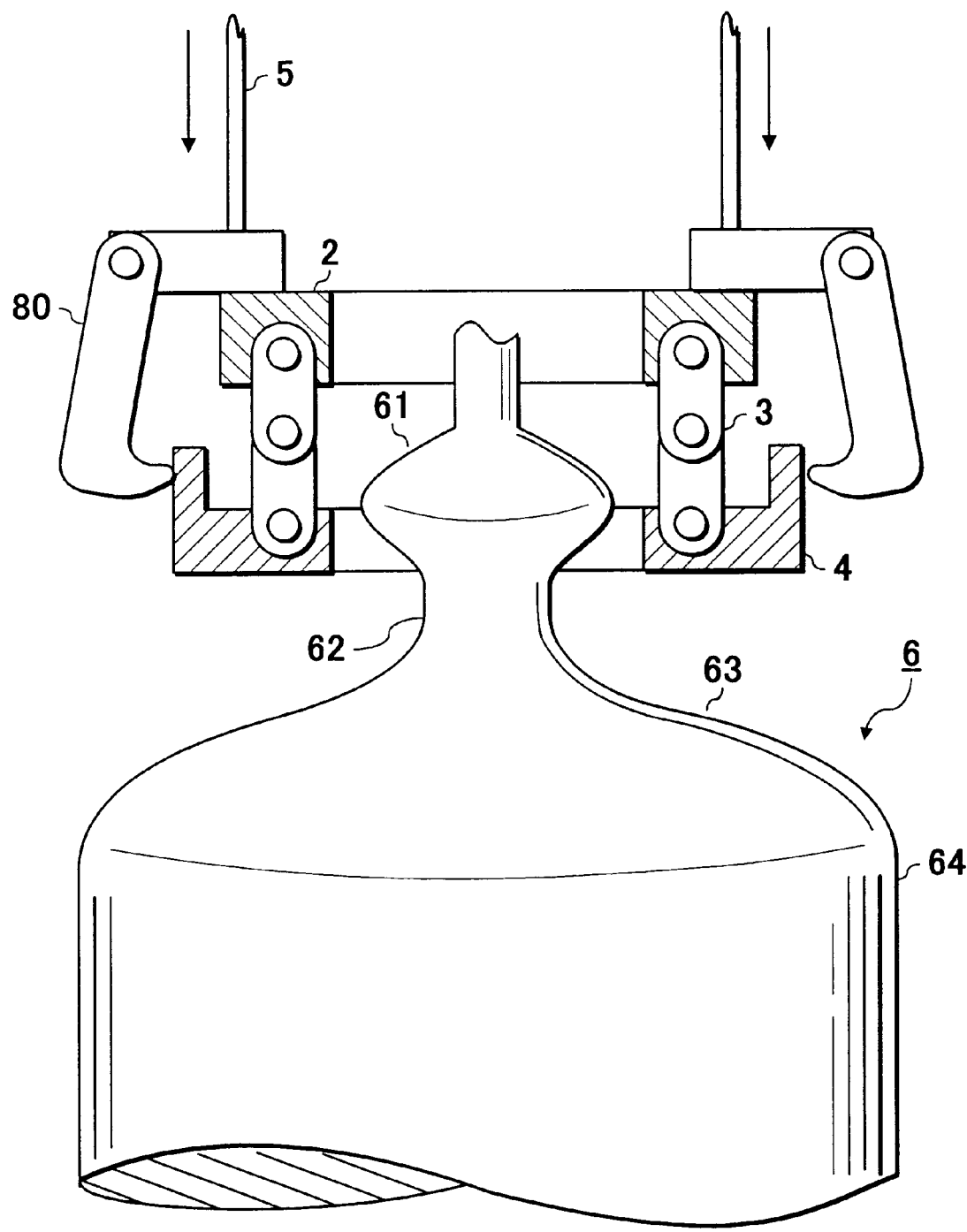
FIG. 12 is a partially sectional view showing the first structure of the crystal-body clamping mechanism in accordance with the fifth embodiment of this invention before the contacting portion 4 contacts the shoulder 63.

FIG. 12 is a partially sectional view showing the first structure of the crystal-body clamping mechanism in accordance with the fifth embodiment of this invention before the contacting portion 4 contacts the shoulder 63.

In this embodiment, a pair of the chacking arms 80 are attached to the clamping portion 2. As shown in this figure, each of the chacking arms 80 stops at the outer peripheral surface of the contacting portion 4 before contacting the shoulder 63.

The clamping portion 2 is arranged above the contacting portion 4, and suspended by the wire cables 5.

The linkage 3 of this embodiment is formed in the joint structure, and links the clamping portion 2 and the contacting portion 4.

Figure 13:
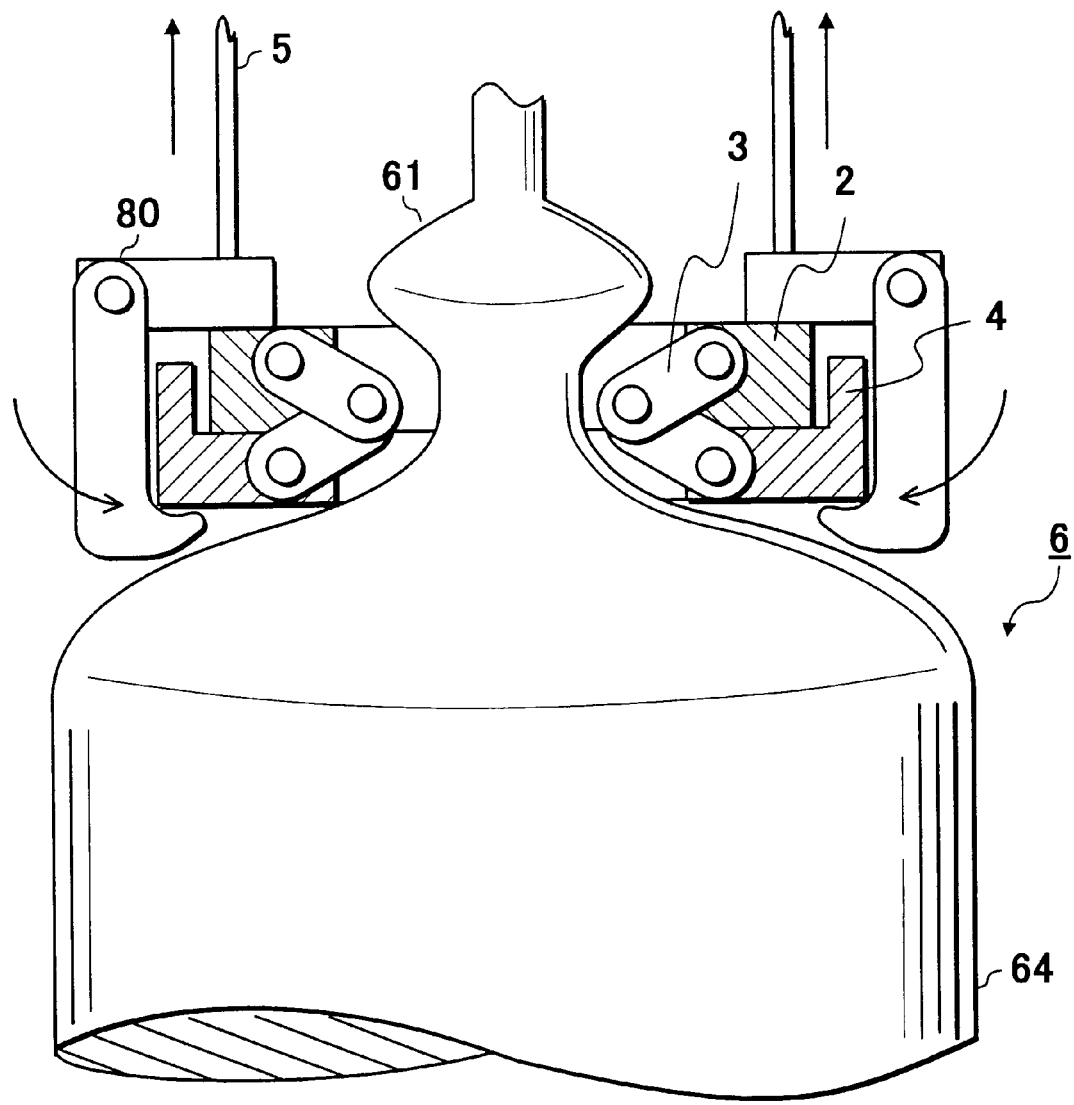
FIG. 13 is a partially sectional view showing the second structure of the crystal-body clamping mechanism in accordance with the fifth embodiment of this invention after the contacting portion 4 contacts the shoulder 63.

FIG. 13 is a partially sectional view showing the second structure of the crystal-body clamping mechanism in accordance with the fifth embodiment of this invention after the contacting portion 4 contacts the shoulder 63.

As shown in this figure, when the contacting portion 4 contacts the shoulder 63, the clamping portion 2 descends together with the chacking arms 80 or the contacting portion 4 rises as the crystal body 6 grows. Consequently, each of the chacking arms 80 holds the bottom edge of the contacting portion 4, and then the linkages 3 protrude inside the neck portion 62. After having changed in this structure, the crystal-body clamping mechanism is raised by the wire cables 5, then each of the linkages 3 clamps the bottom of the large-diameter portion 61. With this structure, the growth weight of the crystal body 6 is supported at the neck portion 62.

The structure of this invention has been described, and the following effects can be achieved.

(1) The operation is automatically actuated by contacting the shoulder of the crystal body; therefore, the clamping is positive. Consequently, the weight of the crystal body can be positively supported and the crystal body can be safely lifted even if the crystal body is heavy.

(2) The circular-arc member is capable of swiveling, therefore its movement is able to respond to that of the crystal body. In the event that horizontal shifting of the crystal body is induced, the circular-arc member can respond in a flexible manner and can clamp the crystal body firmly.

What is claimed is:

1. A crystal-body clamping mechanism provided in a lifting device for forming a crystal body having a neck portion and a should characterized in that:

the claiming mechanism is suspended by suspension members and arranged round the crystal body, and comprises a contacting portion for contacting the shoulder and a clamping portion mechanically connected to the contacting portion for clamping the neck portion when the contacting portion contacts the shoulder.

2. A crystal-body clamping mechanism provided in a lifting device for forming a crystal body having a neck portion and a shoulder, comprising:

a clamping portion suspended by suspension members;

a contacting portion disposed below the clamping portion for contacting the shoulder; and a linkage for connecting the clamping portion and the contacting portion, and driving the clamping portion to clamp the neck portion when the contacting portion contacts the shoulder.

3. A crystal-body clamping mechanism as claimed in claim 2, wherein the clamping portion comprises:

a pair of circular-arc members whose one ends are pivotally supported, and another ends are free to clamp the neck portion.

4. A crystal-body clamping mechanism as claimed in claim 3, wherein the clamping portion is shaped like a ring, and the circular-arc members are formed on an inner sidewall of the clamping portion and engage with the linkage.

5. A crystal-body clamping mechanism as claimed in claim 4, wherein the circular-arc members are shaped in a concave configuration.

6. A crystal-body clamping mechanism as claimed in claim 4, wherein the circular-arc members are divided into two separate portions.

7. A crystal-body clamping mechanism as claimed in claim 3, wherein the clamping portion further comprises:

engaging means for engaging the circular-arc members.

8. A crystal-body clamping mechanism provided in a lifting device for forming a crystal body having a neck portion and a shoulder, comprising:

a clamping portion suspended by suspension members; and a contacting portion suspended from the clamping portion by a flexible wire, for contacting the shoulder.

9. A crystal-body clamping mechanism as claimed in claim 8, wherein the circular-arc members are shaped in a concave configuration.

10. A crystal-body clamping mechanism as claimed in claim 8, wherein the circular-arc members are divided into two separate portions.

* * * * *